United States Patent [19]
Tanaka

[11] Patent Number: 5,911,107
[45] Date of Patent: Jun. 8, 1999

[54] MOS TRANSISTOR READ-ONLY MEMORY DEVICE

[75] Inventor: Takao Tanaka, Tokyo, Japan

[73] Assignee: NEC Corporation, Tokyo, Japan

[21] Appl. No.: 09/148,190

[22] Filed: Sep. 4, 1998

Related U.S. Application Data

[62] Division of application No. 09/100,895, Jun. 22, 1998.

[30] Foreign Application Priority Data

Jun. 23, 1997 [JP] Japan .................................... 9-166073

[51] Int. Cl.⁶ .............................................. H01L 21/8246
[52] U.S. Cl. ........................... 438/276; 438/289; 438/514
[58] Field of Search ..................... 438/514, 289, 438/276; 257/775, 776

[56] References Cited

U.S. PATENT DOCUMENTS

| | | | |
|---|---|---|---|
| 4,839,510 | 6/1989 | Okabe et al. | 257/775 |
| 5,027,175 | 6/1991 | Iwasa | 257/316 |
| 5,031,018 | 7/1991 | Shirato et al. | 257/369 |
| 5,172,198 | 12/1992 | Aritome et al. | 257/315 |
| 5,204,542 | 4/1993 | Namaki et al. | 257/315 |
| 5,418,178 | 5/1995 | Shoji | 438/192 |
| 5,608,241 | 3/1997 | Shibuya et al. | 257/207 |
| 5,691,551 | 11/1997 | Eimori | 257/303 |
| 5,760,452 | 6/1998 | Terada | 257/386 |
| 5,811,862 | 9/1998 | Okugaki et al. | 257/390 |

FOREIGN PATENT DOCUMENTS 61-288464  12/1996  Japan .

*Primary Examiner*—Peter Toby Brown
*Assistant Examiner*—Maria Guerrero
*Attorney, Agent, or Firm*—Sughrue, Mion, Zinn, Macpeak & Seas, PLLC

[57] ABSTRACT

A MOS semiconductor ROM device is provided which is capable of preventing an ion implantation region of one memory cell from overlapping into a region of an adjacent memory cell and causing a threshold voltage $V_T$ of the adjacent memory cell from rising. The device contains a semiconductor substrate, first and second linear regions, first and second interconnect lines, a first notch, and a first doping area. The first linear region is formed over the semiconductor substrate, and the second linear region is formed over the semiconductor substrate parallel to the first linear region. The first interconnect line is formed over the semiconductor substrate and is perpendicular to the first and second linear regions, and the second interconnect line is formed over the substrate parallel to the first interconnect line. The first notch is formed in the first interconnect line between the is first and second linear regions to form a narrowed portion of the first interconnect line. The first doping area is defined between the first and second linear regions and below the narrowed portion of the first interconnect line and is doped with impurities.

15 Claims, 9 Drawing Sheets

12 SiN LAYER
11 SiO2 LAYER
10 P Si SUBSTRATE

13 RESIST FILM

17 WSi FILM
16 POLY-Si FILM
15 GATE OXIDE FILM
10

Fig. 6 (a) PRIOR ART
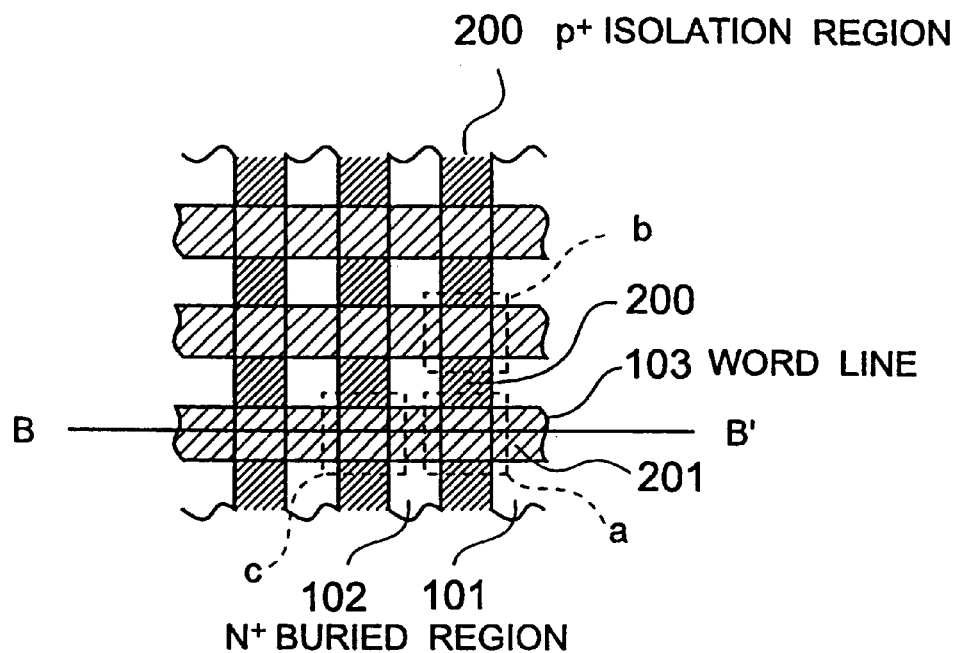
Fig. 6 (b) PRIOR ART
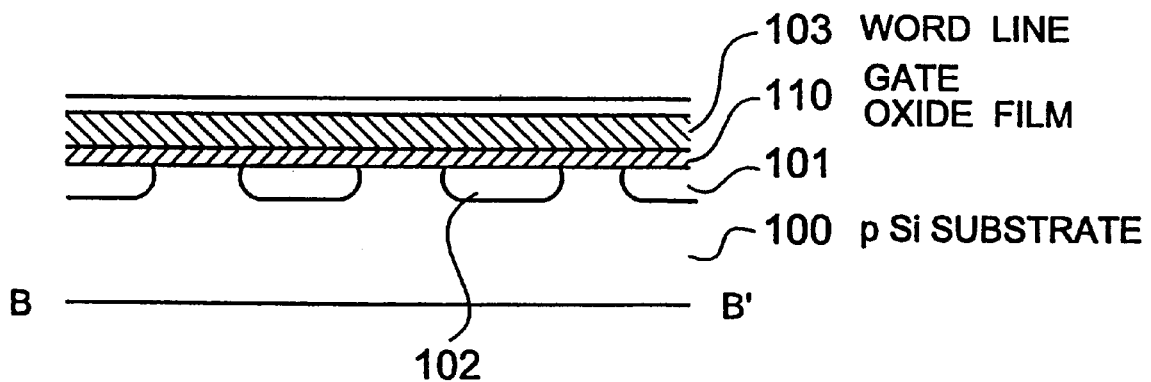

Fig. 7 (a) PRIOR ART
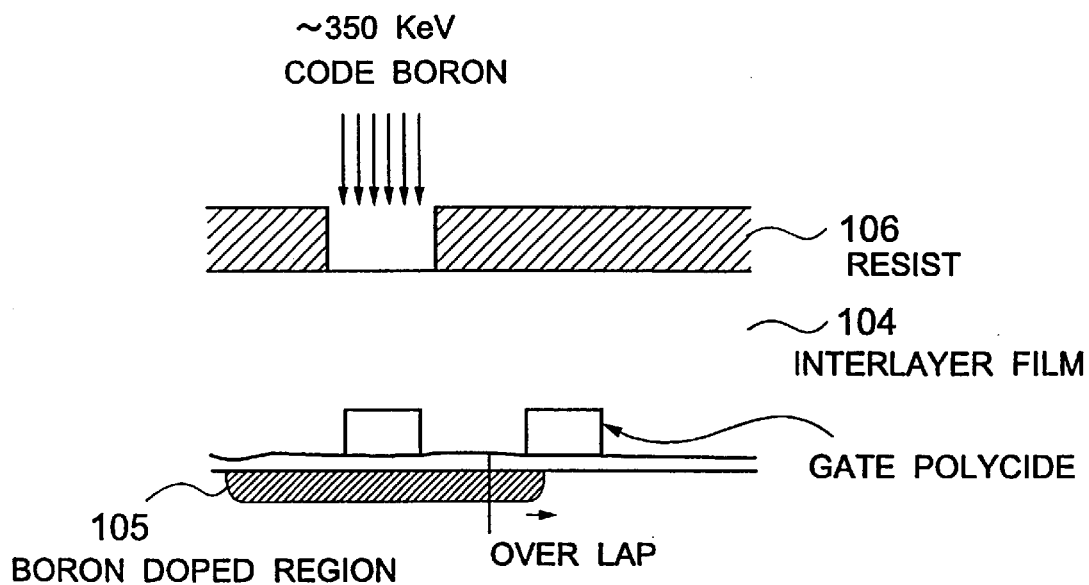
Fig. 7 (b) PRIOR ART
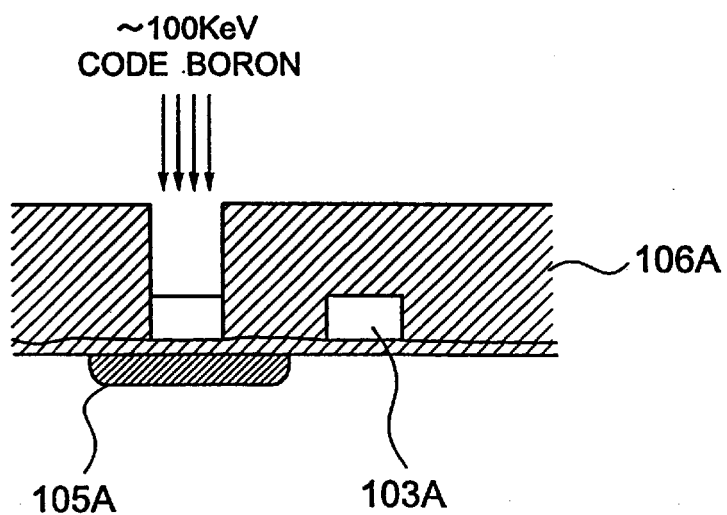

MOS TRANSISTOR READ-ONLY MEMORY DEVICE

This is a divisional of application Ser. No. 09/100,895 filed Jun. 22, 1998, the disclosure of which is incorporated herein by reference.

FIELD OF THE INVENTION

The present invention relates to a semiconductor read only memory ("ROM") such as a MOS mask ROM. In particular, the present invention relates to a ROM in which an ion implantation region corresponding to one memory cell does not extend into a region of an memory adjacent cell.

BACKGROUND OF THE INVENTION

FIGS. 6(a) and 6(b) illustrate the structure of a conventional MOS mask ROM disclosed in Japanese Unexamined Patent Publication No. Sho 61-288464. The MOS mask ROM disclosed in the publication is a flat-cell MOS mask ROM in which a diffusion layer formed by ion implantation is formed on an isolation region to form a flat surface. Thus, the flat-cell mask ROM is different than a mask ROM in which an isolation region is formed by selective oxidization by using a LOCOS process. FIG. 6(a) is a top view of the conventional MOS mask ROM, and FIG. 6(b) shows a cross sectional view along line B–B' in FIG. 6(a).

As shown in the figures, the MOS mask ROM comprises a P silicon substrate 100, and linear $N^+$ buried regions 101 and 102 are alternatively formed in parallel in one direction on the substrate 1. The $N^+$ buried region 101 forms a source region for a plurality of memory transistors (e.g. transistors "a" and "b") and corresponds to a ground line of the mask ROM. The $N^+$ buried region 102 forms a drain region for the transistors "a" and "b" and corresponds to a bit line of the mask ROM. Also, a gate oxide film 110 is formed over the substrate 100 and the $N^+$ buried regions 101 and 102, and a plurality of a parallel word lines 103 made of polysilicon are formed on the gate oxide film 110. Also, the word lines 103 are formed perpendicularly to the linear $N^+$ buried regions 101 and 102 and serve as the gate electrodes of a plurality of memory transistors (e.g. transistors "a" and "c") in the mask ROM.

In addition, as shown in FIG. 6(a) $P^+$ isolation regions 200 (illustrated as crosshatched squares) are ion-implanted via a self-alignment process based on the $N^+$ buried regions 101 and 102 and the word lines 103. In other words, the $N^+$ buried regions 101 and 102 are very highly doped, and thus, the implanting of ions to form the $P^+$ isolation regions 200 does not change the $N^+$ buried regions 101 and 102 into $P^+$ regions. Therefore, the word lines 103 can be used as a mask for the regions other than the $N^+$ buried regions 101 and 102, and a separate mask does not need to be formed over the regions 101 and 102 when the $P^+$ isolation regions 200 are formed. Each of the isolation regions 200 serves as an isolation region between adjacent memory transistors formed by adjacent word lines 103. For example, the transistor "a" and the transistor "b" are located on adjacent word lines 103 and are separated by the isolation region 200a. Also, a region which is located between the $N^+$ buried region 101 and the $N^+$ buried region 102 and is located directly below the word line 103 is a channel region 201. Thus, each of the transistors in ROM have a channel region 201.

In the conventional MOS mask ROM mention above, the data stored in the ROM (i.e. a ROM code) is formed by selectively doping certain memory transistors with boron. Specifically, a resist pattern is formed via a photolithography process over the MOS mask ROM and boron is doped into selected transistors while using the resist as a mask. (Such a process is referred to as a "code boron doping process". Since the threshold voltage $V_T$ of a boron-doped memory transistor increases and the threshold voltage $V_T$ of an undoped transistor remains the same, data can be read from the ROM based on the difference between the thresholds voltages $V_T$ of the transistor. For example, a transistor having a high threshold voltage $V_T$ will not turn ON when a voltage $V_{READ}$ (having a voltage lower than the high threshold voltage $V_T$) is applied to its gate electrode (i.e. the word line 103). On the other hand, a transistor having a normal threshold voltage $V_T$ will turn on when the voltage $V_{READ}$ is applied to the gate electrode (i.e. the word line 103). The ROM may consider the transistors that do not turn on to output a logic "1" and may consider the transistors that do turn on to output a logic "0".

Generally, the mask ROM also has bank selector lines in addition to the word lines 103. Therefore, in addition to doping transistors with boron to create the ROM code, predetermined cells formed by the bank selector lines need to be doped with boron to create channel stops in the predetermined cells in order to sever an undesired current path when data is read from the ROM. (The process of doping boron in predetermined cells formed by the bank selector lines is referred to as a "channel stop boron doping process".

The conventional MOS mask ROM suffers from several disadvantages. For example, as shown in FIG. 7(a), the design of the mask ROM requires an interlayer film 104 having a thickness of 3000 to 5000 angstrom to be formed over the word lines and/or bank selector lines 103. Then, in order to perform the code boron doping process and/or channel stop boron doping process, a resist 106 is formed over the interlayer film 104, and the resist 106 has openings which correspond to the portions of the ROM which are to be ion implanted with boron during the doping processes. Then, boron is doped into the transistor cells via an ion implantation process while using the resist 106 as a mask. Since the boron must travel through the interlayer film 104, the implantation process is conducted with an implantation energy of about 200 to 350 KeV to form a boron implantation region 105. Since such a large amount of ion implantation energy is used to implant the boron, the boron implantation region 105 becomes relatively large and seeps into a portion below an adjacent word line (or bank selector line) 103. (See FIG. 7 (a)).

In contrast, FIG. 7(b) illustrates an earlier process in which boron ions can be implanted to form a boron doped region 105A of a semiconductor device which does not require the use of an interlayer film during the doping process. Since the boron does not have to travel through an interlayer film, the boron can be implanted with an ion implantation energy of only 100 to 150 KeV using a photoresist 106A. Thus, as shown in the figure, the boron doped region 105A does not seep into a region below an adjacent word line (or bank selector line) 103A. However, after the boron is implanted, an interlayer layer must be formed over the doped region 105A and the word line (or bank selector line) 103A. Therefore, the customization of the ROM for a particular customer must be done before the interlayer layer is formed. Such processes inhibit the speed with which the ROMs can be mass produced.

In the conventional MOS mask ROM, when the boron doped region 105 seeps into the portion below the adjacent word line 103, the threshold voltage $V_T$ of a memory cell formed by the adjacent word line 103 increases, and thus, the speed at which data can be read from the adjacent cell increases. The above problem is not limited to a flat-cell ROM. For example, in a MOS mask ROM in which an isolation region is formed by an isolation diffusion process, a similar problem occurs because the implantation of ions to form the ROM code is performed by doping ions through an interlayer film. Thus, the doped ion region becomes large and seeps into adjacent regions corresponding to adjacent memory cells for the reasons presented above in conjunction with FIG. 7(a).

SUMMARY OF THE INVENTION

An object of the present invention is to provide a MOS semiconductor ROM device which is capable of preventing an ion implantation region of one cell from overlapping into a region of an adjacent cell and causing a threshold voltage $V_T$ of the adjacent cell from rising.

In order to achieve the above and other objects, a semiconductor device is provided. The semiconductor device comprises: a semiconductor substrate; a first linear region formed over said semiconductor substrate; a second linear region formed over said semiconductor substrate, wherein said second linear region is substantially parallel to said first linear region; a first interconnect line formed over said semiconductor substrate, wherein said first interconnect line is aligned in a direction which intersects a direction in which said first and second linear regions are aligned; a second interconnect line formed over said semiconductor substrate, wherein said second interconnect line is substantially parallel to said first interconnect line; a first notch formed in said first interconnect line between said first and second linear regions to form a narrowed portion of said first interconnect line; and a first doping area defined between said first and second linear regions and below said narrowed portion of said first interconnect line, wherein said first doping area is doped with impurities.

In order to further achieve the above and other objects, a method for manufacturing a semiconductor device is provided. The method comprises the steps of: (a) forming first and second linear regions having a first conductivity type in a semiconductor substrate, wherein said first and second linear regions are substantially parallel; (b) forming first and second interconnect lines over said semiconductor substrate, wherein said first interconnect line is aligned in a direction which intersects a direction in which said first and second linear regions are aligned and wherein said second interconnect line is substantially parallel to said first interconnect line; (c) forming a first notch in said first interconnect line between said first and second linear regions to form a narrowed portion of said first interconnect line; and (d) doping impurities into a first doping area defined between said first and second linear regions and below said narrowed portion of said first interconnect line.

BRIEF DESCRIPTION OF THE DRAWINGS

The above objects and advantages of the present invention will become more apparent by describing in detail preferred embodiments thereof with reference to the attached drawings in which:

FIG. 1(b) is a cross sectional view along line A–A' in FIG. 1(a);

FIG. 6(a) is a top view of a conventional MOS mask ROM;

FIG. 6(b) is a cross sectional view along a line B–B' in FIG. 6(a);

FIG. 7(a) illustrates a process in which ions are implanted through an interlayer film;

FIG. 7(b) illustrates a process in which ions are not implanted through an interlayer film;

DETAILED DESCRIPTION OF THE PREFERRED EMBODIMENTS

The following description of the preferred embodiments discloses specific configurations and components. However, the preferred embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations and components of the present invention which would have been known to one skilled in the art are omitted for the sake of clarity and brevity.

Figure 1:
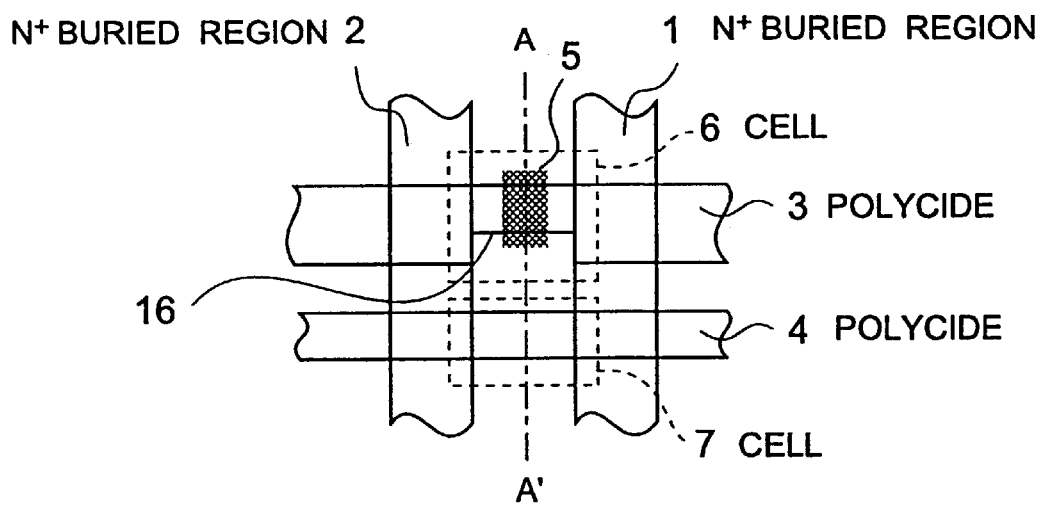
FIG. 1 (a) is a top view illustrating a structure surrounding a transistor memory cell in a MOS transistor ROM in accordance with one embodiment of the present invention.
Figure 1:
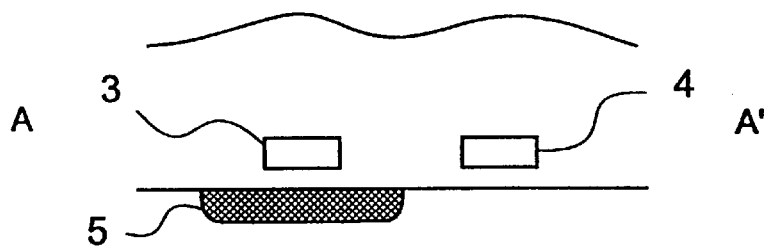

FIG. 1(a) is a top view of an area of a MOS transistor ROM in accordance with one embodiment of the present invention, and FIG. 1(b) is a cross sectional view along the line A–A' in FIG. 1(a). As shown in the figures, the MOS transistor ROM comprises linear $N^+$ buried regions 1 and 2, a word line 3, and a bank selector line 4. The $N^+$ buried regions 1 and 2 are alternately aligned in parallel on a semiconductor substrate (e.g. a P silicon substrate). Also, the $N^+$ buried region 1 constitutes a ground line and forms the source region for a column of transistor memory cells 6 of the ROM, and the $N^+$ buried region 2 constitutes a bit line and forms the drain region for the column of memory cells 6.

The word line 3 and bank selector line 4 are made of polycide and are arranged in parallel over the semiconductor substrate and are arranged perpendicularly to the $N^+$ buried regions 1 and 2. The area at which the word line 3 (i.e. gate electrode) intersects the $N^+$ buried region 1 (i.e. source region) and the $N^+$ buried region 2 (i.e. drain region) forms a transistor memory cell 6 of the MOS transistor ROM. Also, the area formed between the $N^+$ buried regions 1 and 2 (i.e. the source and drain regions) which is located directly underneath, the word line 3 (or bank selector line 4) constitutes a channel.

Also, as shown in FIG. 1(a), a notch 16 is formed in a portion of the word line 3 which faces the bank selector line 4 and which is located between the $N^+$ buried regions 1 and 2. By forming the notch 16 in the word line 3, an ion implantation region 5 formed below the cell 6 when code is written into the ROM can be made smaller and can still adequately increase the threshold voltage $V_T$ of the cell 6. In other words, the notch 16 reduces the width of the word line 3 bridging the $N^+$ buried regions 1 and 2 (i.e. the source and drain regions) of a transistor memory cell 6, and therefore, the channel region of the cell is reduced in width. As a result, the opening in a resist used to implant ions in the channel region to form the ion implantation region 5 becomes smaller, and thus, the size of the ion implantation region 5 is reduced. As shown in FIG. 6(b), when the size of the implantation region 5 is reduced, the region 5 does not extend into a region corresponding to an adjacent cell 7 formed by the bank selector line 4.

Also, in present embodiment, isolation regions between adjacent word lines 3 and/or bank selector lines 4 may also be formed by creating $P^+$ buried regions via an ion implantation process using a self alignment process based on the $N^+$ buried regions 1 and 2, the word lines 3 and/or the bank selector lines 4. Also, the isolation regions may be formed by other known isolation diffusion processes.

Figure 2A:
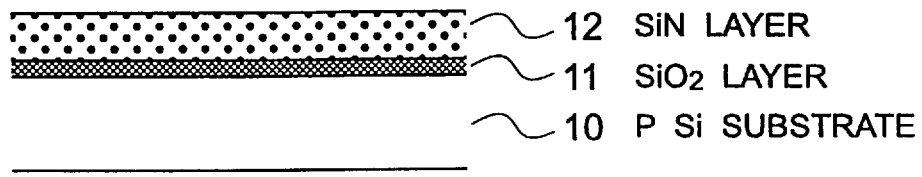
FIGS. 2(a) to 2(d) are cross sectional views of a fabrication process of the MOS transistor ROM according to one embodiment of the present invention.
Figure 2B:
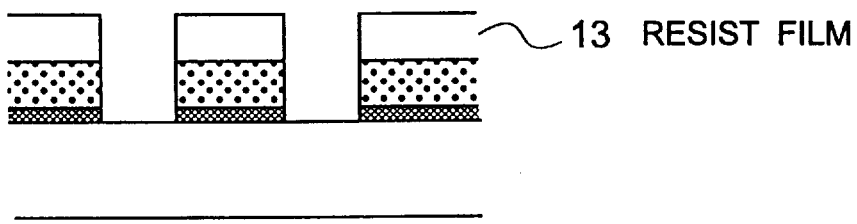
Figure 2C:
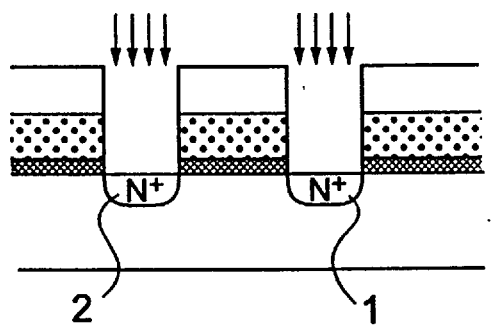
Figure 2D:
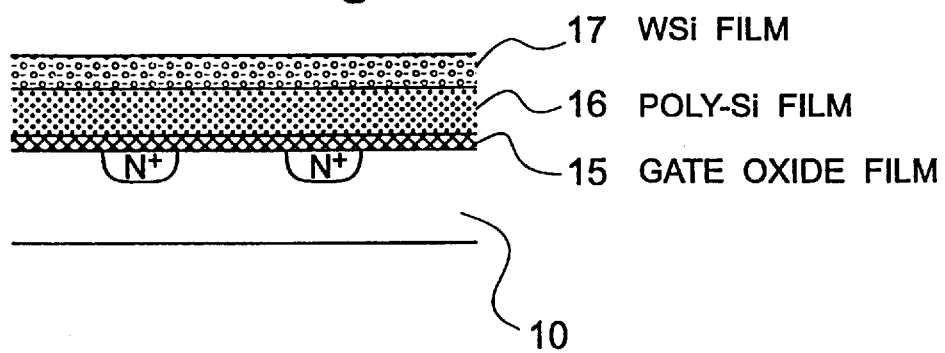

FIGS. 2(a) to 2(d) illustrate cross sectional views of the steps in a method for fabricating the MOS transistor ROM described in the embodiment above. As shown in FIG. 2 (a), an $SiO_2$ layer 11 is formed on a P silicon substrate 10, and an SiN layer 12 is formed on the $SiO_2$ layer 11. Then, as shown in FIG. 2(b), a photoresist film 13 is formed over the entire surface using a known photolithography process, and a dry etching process is performed using the photoresist film 13 as a mask to remove the portions of the films 10 and 11 which are disposed over areas corresponding to the $N^+$ buried regions 1 and 2. Afterwards, as shown in FIG. 2(c), an impurity (e.g. arsenic) is ion-implanted to form $N^+$ buried regions 1 and 2, and the SiO2 layer 11, the SiN layer 12, and the photoresist layer 13 are subsequently removed by a known etching process. Then, as shown in FIG. 2(d), a gate oxide film 15 is formed on the substrate 10, and a polysilicon film 16 is formed on the oxide film 15. Then a WSi film 17 is formed on the polysilicon film 16, and a photolithography process and a dry etching process are performed to form the word line 3 and bank selector line 4 illustrated in FIG. 1(a). When the gate lines 3 and 4 are etched, the mask used during the photolithography process is patterned to form the notch 16 at a predetermined portion of a predetermined word line 3 and a predetermined bank selector line 4. Afterwards, an interlayer film 35 is formed over the lines 3 and 4, and a ROM code is stored in the ROM.

Figure 3:
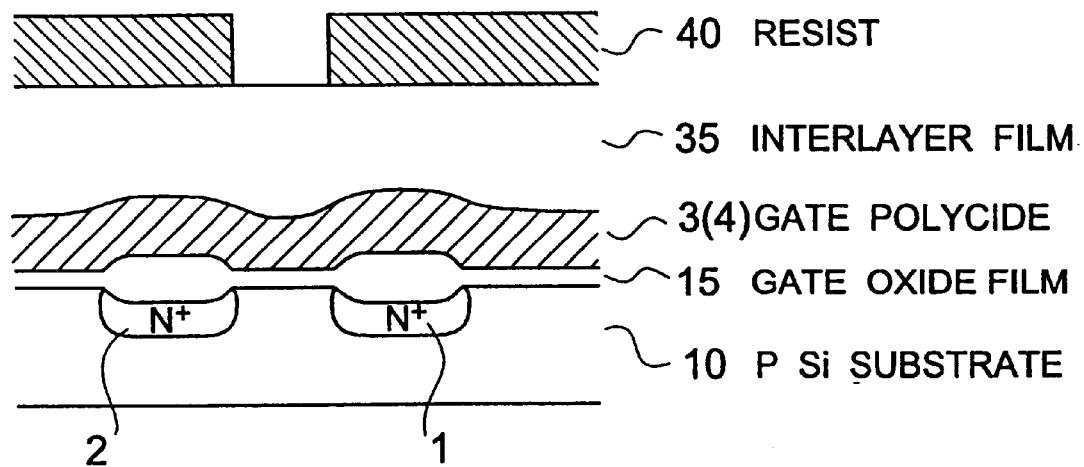
FIGS. 3(a) and 3(b) are cross sectional views of a process for forming a ROM code in the MOS transistor ROM according to one embodiment of the present invention.
Figure 3:
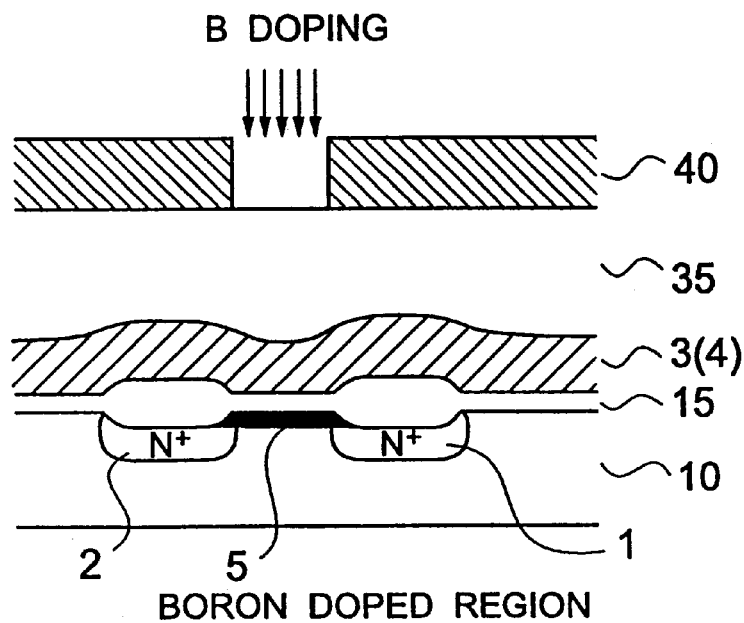

FIGS. 3(a) and 3(b) are cross sectional views illustrating the steps of a process for storing the ROM code in the MOS transistor ROM. As shown in FIG. 3(a), $N^+$ buried regions 1 and 2 are formed in a polysilicon substrate 10, and a gate oxide film is formed over the regions 1 and 2. Then, a gate polycide film is formed on the oxide film 15 and etched to provide a word line 3 and/or a bank selector line 4, and an interlayer film 35 is formed over the gate polycide film 3/4. Then, a resist 40 (or a resist and a nitride film) is formed over the entire surface via a photolithography process and has an opening located at a position corresponding to a code boron doped region (or a channel stop boron doped region).

Afterwards, as shown in FIG. 3(b), a code boron doping process (or channel stop boron doping process) is conducted using the resist 40 as a mask to implant boron between the $N^+$ buried regions 1 and 2 to form a code boron doped region 5 (or a channel stop boron doped region). As a result, when the boron doped region 5 is formed in a predetermined transistor memory cell, the threshold voltage $V_T$ of the cell rises.

During the process of storing ROM code in the MOS transistor ROM, the particular cells which are located under a particular word line 3 (i.e. word line cells) and which are to be subjected to the code boron doping process depends upon the particular data to be stored in the ROM. Therefore, the particular word line cells which are doped differ from user to user. On the other hand, the cells which are located under the bank selector lines 4 (i.e. bank selector line cells) and which are to be subjected to the channel stop doping process are the same for all users. Therefore, when notches 16 are provided in the word lines 3 and the bank selector lines 4, the notches 16 may be formed only in the portions of the bank selector lines 4 which correspond to particular cells to be doped. However, notches 16 should be provided on the portions of the word lines 3 which correspond to all of the cells. Thus, when customized data is stored in the ROM, each portion of the word lines which corresponds to a cell in which data may potentially be written (i.e. each cell which could be potentially subjected to the code boron doping process) will contain a notch 16.

Figure 4:
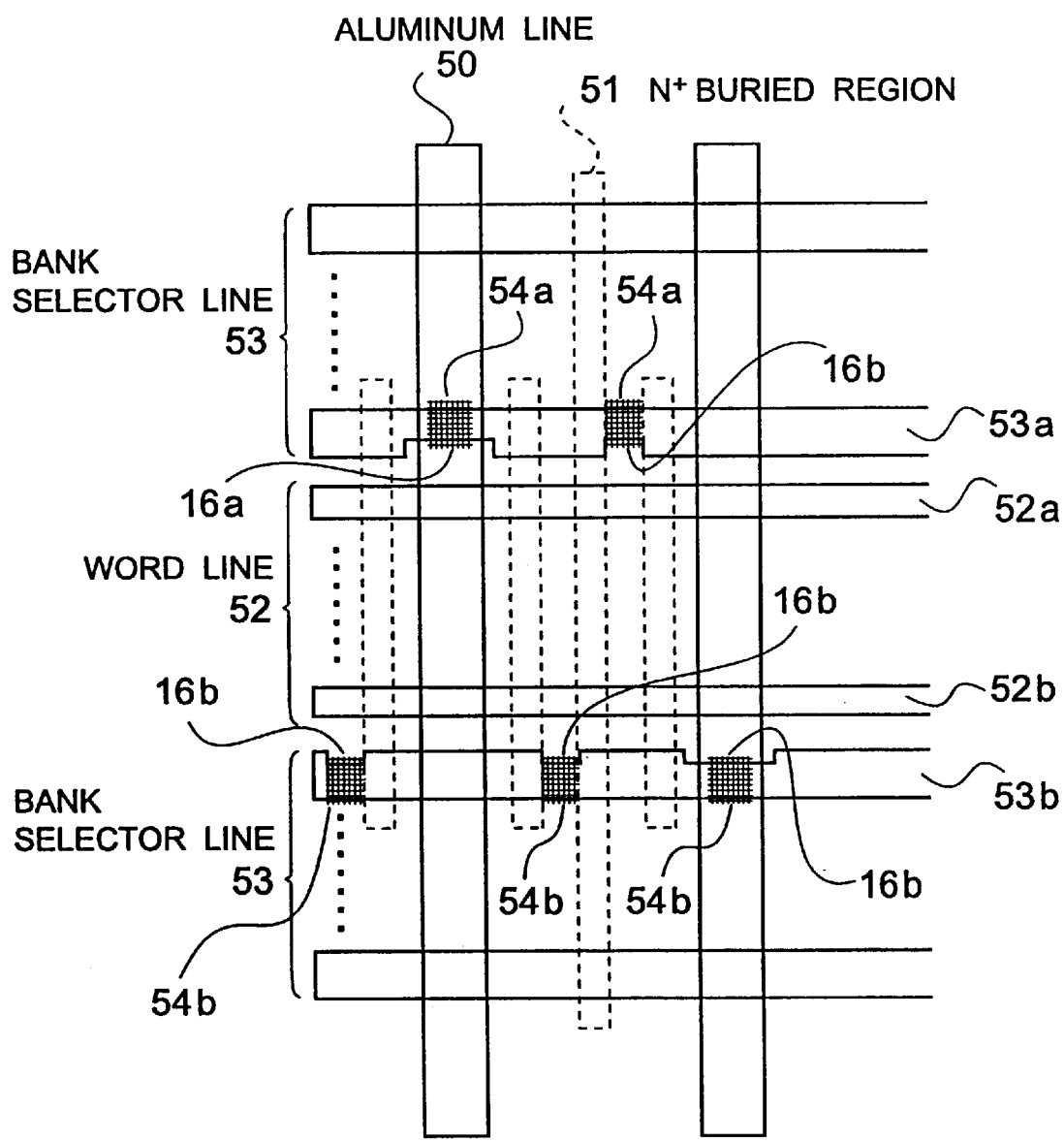
FIG. 4 is a top view of an illustrative practical example of the MOS transistor ROM according to one embodiment of the present invention.

FIG. 4 illustrates a practical example implementing the MOS transistor ROM of the present embodiment. As shown in the figure, a plurality of aluminum bit lines 50 and a plurality of $N^+$ buried regions 51 are vertically formed on a semiconductor substrate. Also, a plurality of word lines 52 and a plurality of bank selector lines 53 are formed in a horizontal direction on the substrate and intersect the aluminum bit lines 50 and the regions 51.

Also, the bank selector lines 53 are grouped together to form a first group and a second group, and the word lines 52 are grouped together. Also the groups of bank selector lines 53 are disposed on each side of the group of word lines 52. As a result, the first group of lines 53 contains a bank selector line 53a which is adjacent to a word line 52a, and the second group of lines 53 contains a bank selector line 53b which is adjacent to another word line 52b. Also, the bank selector line 53a comprises notches 16a which are formed between the $N^+$ buried regions 51 and which face the adjacent word line 52a. In addition, channel stop boron doping is performed in the cells corresponding to the notched portions of the bank selector line 53a to form channel stop boron doped regions 54a. Similarly, the bank selector line 53b comprises notches 16b which are formed between the $N^+$ buried regions 51 and which face the adjacent word line 52b. Also, channel stop boron doping is performed in the cells corresponding to the notched portions of the bank selector line 53b to form channel stop boron doped regions 54b.

As shown in the memory device above, the channel stop boron doped regions 54a and 54b of the bank selector lines 53a and 53b do not extend into the area below the adjacent word lines 52a and 52b. As a result, the threshold voltage $V_T$ of the corresponding cells of the adjacent word lines 52a and 52b does not increase, and the time required to read data from such cells does not increase.

Figure 5:
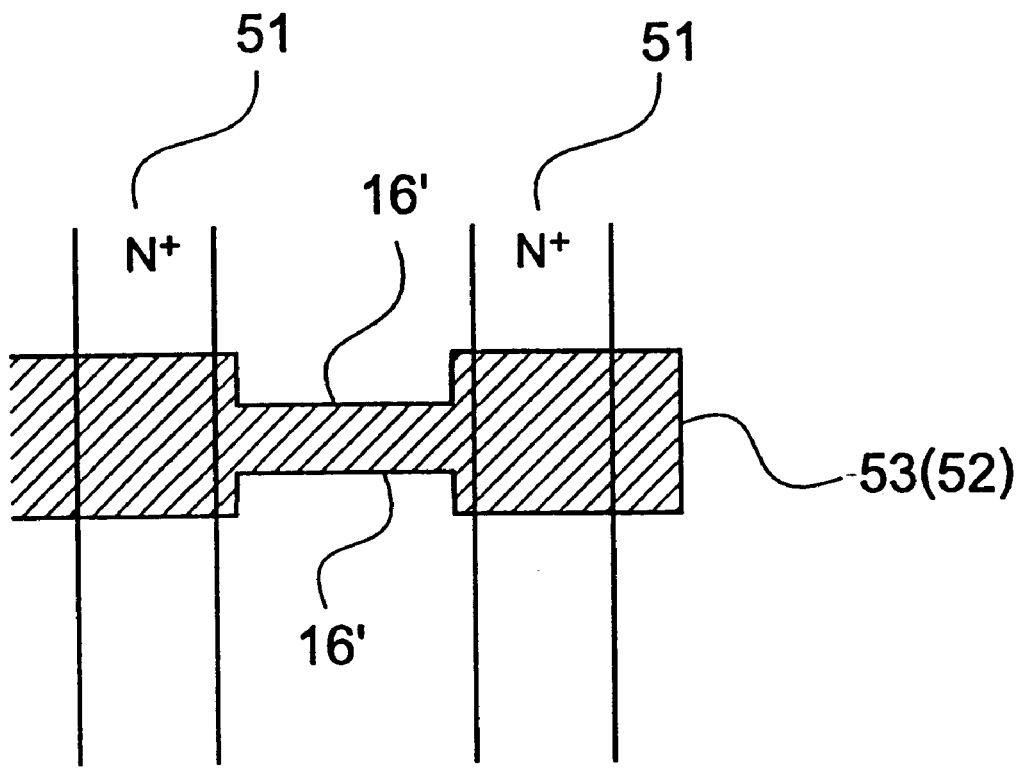
FIG. 5 is a diagram illustrating an example of a notch shape in a word line or a bank selector line of the MOS transistor ROM according to one embodiment-of the present invention.

In the embodiment described above, the notches 16a and 16b are provided only for the bank selector lines 53a and 53b because their width is large and because they are adjacent to the word lines 52a and 52b. For a circuit having a current margin, notches 16 may also be provided in the other bank selector lines 53 and in the word lines 53 to prevent the threshold voltages $V_T$ of many more cells in the ROM from erroneously increasing. Also, in the embodiment described above, the notch 16 is provided only at the side of the bank selector lines 53a and 53b which respectively face the word lines 52a and 52b. However, notches 16' may be formed at both sides of the bank selector lines 53 and the word lines 52 as shown in FIG. 5. As a result, the threshold voltage $V_T$ of the cells which are adjacent to both sides of the lines 53 and/or 52 are prevented from increasing.

Figure 8:
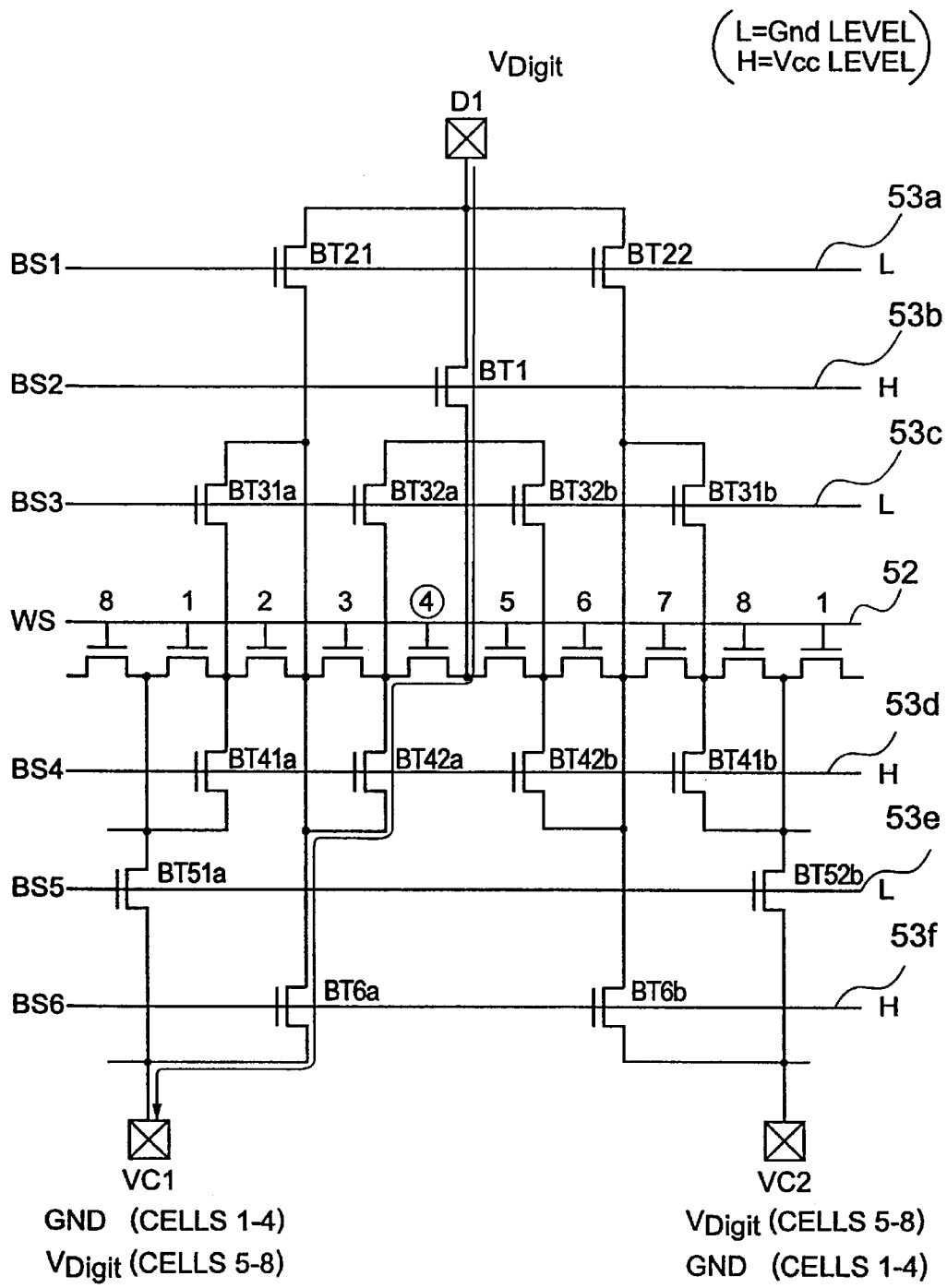
FIG. 8 illustrates the relationship between a word line and a plurality of bank selector lines.
Figure 9:
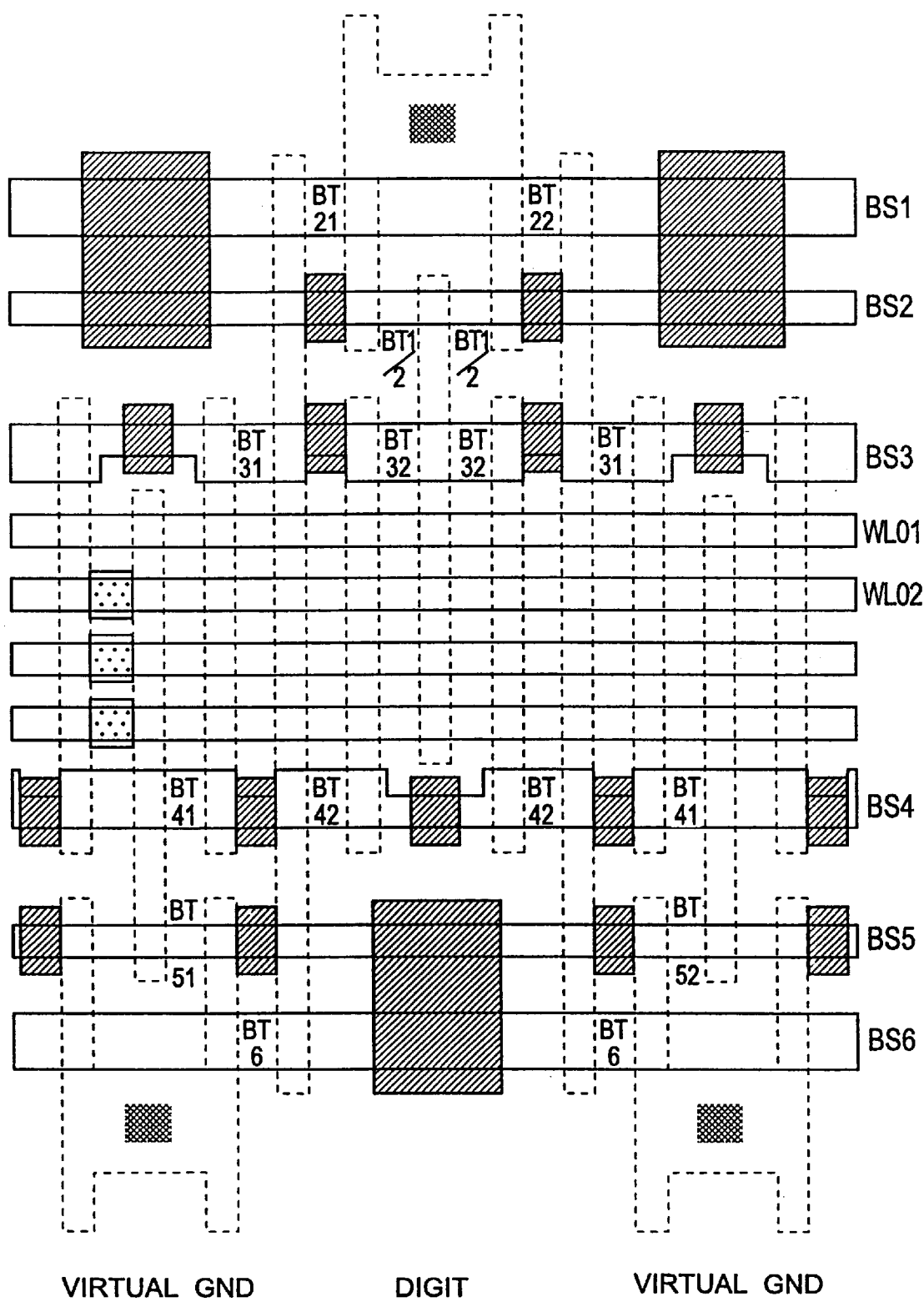
FIG. 9 illustrates a layout diagram which includes the circuitry shown in FIG. 8.

FIG. 8 illustrates the relationship between a word line 52 and a plurality of bank selector lines 53a to 53f. As shown in the figure, by using the six bank selector lines 53a to 53f, one digit line D1 can be used to read data from the eight cells covered by the word line 52. For example, as shown in the figure, if a $V_{cc}$ level signal is applied to bank selector lines 53b, 53d, and 53f, and GND level signal is applied to bank selector lines 53a, 53c, and 53e, the data in the fourth memory cell covered by the word line will be read and output via the terminal VG1. Specifically, since a GND level signal is applied to the line 53a, the transistors BT21 and BT22 are turned OFF. However, since a $V_{cc}$ level signal is applied to the bank selector line 53b, the transistor BT1 is turned ON, and the signal on the digit line is applied to the memory cell 4 of the word line 52. Since a $V_{cc}$ level signal is applied to the bank selector line 53d, the transistors BT41a, BT42a, BT41b, and ET42b are turned ON. Thus, assuming that the memory cell 4 is turned ON (i.e. has the proper boron doping), the signal flows through the cell 4 and flows through the transistor BT42a. Finally, since a $V_{cc}$ level signal is applied to the bank selector line 53f and the transistors BT6a and BT6b are turned on, the data is output via the transistor BT6a to the terminal VG1. Also, when data is read from cells 1 to 4, the terminal VG1 acts as a virtual ground terminal and outputs the data. On the other hand, when data is read from cells 5 to 8, the terminal VG2 acts as a virtual ground terminal and outputs the data. FIG. 9 illustrates a layout diagram which includes the circuitry shown in FIG. 8. As described above, the bank selector lines 53a to 53f are used in the same manner regardless of the data stored in the word line 52. Therefore, the cells corresponding to the bank selector lines 53a to 53f are doped in the same manner for each ROM. On the other hand, the cells in the word line 52 are different depending on the specifications of a particular user. Therefore, the cells of the word line 52 may be doped differently for each user.

As mentioned above, the present invention prevents boron doped regions of one cell from extending into a region of an adjacent cell. Thus, the threshold voltage $V_T$ of the adjacent cell is prevented from rising, and the speed at which data can be read from the adjacent cell is not reduced. Therefore, the present invention eliminates data errors when the ROM is read during a data reading operation.

The previous description of the preferred embodiments is provided to enable a person skilled in the art to make or use the present invention. Moreover, various modifications to these embodiments will be readily apparent to those skilled in the art, and the generic principles defined herein may be applied to other embodiments without the use of inventive faculty. Therefore, the present invention is not intended to be limited to the embodiments described herein but is to be accorded the widest scope as defined by the claims.

What is claimed:

1. A method for manufacturing a semiconductor device comprising the steps of:

(a) forming first and second linear regions having a first conductivity type in a semiconductor substrate, wherein said first and second linear regions are substantially parallel;

(b) forming first and second interconnect lines over said semiconductor substrate, wherein said first interconnect line is aligned in a direction which intersects a direction in which said first and second linear regions are aligned and wherein said second interconnect line is substantially parallel to said first interconnect line;

(c) forming a first notch in said first interconnect line between said first and second linear regions to form a narrowed portion of said first interconnect line; and (d) doping impurities into a first doping area defined between said first and second linear regions and below said narrowed portion of said first interconnect line.

2. The method as claimed in claim 1, wherein said first and second linear regions form a source and a drain of a transistor, and wherein said first interconnect line forms a gate electrode of said transistor.

3. The method as claimed in claim 1, wherein said first notch faces said second interconnect line.

4. The method as claimed in claim 1, wherein said step (c) comprises the step of:

(c1) forming a second notch in said first interconnect line between said first and second linear regions to further form said narrowed portion of said first interconnect line, wherein said second notch is formed at a side of said first interconnect line which is opposite to a side of said first interconnect line on which said first notch is formed.

5. The method as claimed in claim 1, wherein said step (b) comprises the steps of:

(b1) forming an oxide film over said first and second linear regions;

(b2) forming an interconnect layer over said oxide film; and (b3) etching said interconnect layer to form said first and second interconnect lines.

6. The method as claimed in claim 1, wherein said step (d) comprises the steps of:

(d1) forming a photoresist over said first and second interconnect lines, wherein said photoresist has an opening which corresponds to a size of first doping area and a width of said narrowed portion; and (d2) doping impurities into said first doping area by implanting impurities via said opening.

7. The method as claimed in claim 2, wherein said impurities in said first doping area increase a threshold voltage of said transistor.

8. The method as claimed in claim 3, wherein said step (b) comprises the step of:

(b1) forming a third interconnect line over said semiconductor substrate, wherein said third interconnect line is substantially parallel to said first interconnect line and wherein said first interconnect line is disposed between said second interconnect line and said third interconnect line, wherein said step (c) comprises the step of:

(c1) forming a second notch in said first interconnect line between said first and second linear regions to further form said narrowed portion of said first interconnect line, wherein said second notch faces said third interconnect line.

9. The method as claimed in claim 5, wherein said step (b3) comprises the steps of:

(b3a) forming a photoresist over said interconnect layer; and (b3b) etching said interconnect layer to form said first and second interconnect lines by using said photoresist as a mask.

10. The method as claimed in claim 9, wherein said step (c) comprises the step of:

(c1) forming said first notch in said step (b3b) by patterning said photoresist to correspond to said first notch and etching said interconnect layer.

11. The method as claimed in claim 7, wherein said first interconnect line forms one of a word line and a bank selector line in said semiconductor device.

12. The method as claimed in claim 11, wherein said impurities in said first doping area do not overlap a second area corresponding to a second transistor of said semiconductor device.

13. The method as claimed in claim 11, wherein said one of a word line and a bank selector line is a bank selector line.

14. The method as claimed in claim 12, wherein said one of a word line and a bank selector line is a word line, and wherein said transistor forms a transistor memory cell of said semiconductor device.

15. The method as claimed in claim 13, wherein said second interconnect line is a word line and said first notch faces said word line.

* * * * *

UNITED STATES PATENT AND TRADEMARK OFFICE
CERTIFICATE OF CORRECTION

PATENT NO. : 5,911,107
DATED : June 8, 1999
INVENTOR(S) : Takao TANAKA

It is certified that error appears in the above-identified patent and that said Letters Patent is hereby corrected as shown below:

Column 7, line 20, delete "ET42b" and insert --BT42b--.

Signed and Sealed this

Twenty-second Day of February, 2000

Attest:

Q. TODD DICKINSON

Attesting Officer

Commissioner of Patents and Trademarks